XR 3,673,474

United States

White et al.

[15] 3,673,474

[45] June 27, 1972

[54] MEANS FOR GENERATING (A SOURCE OF) SURFACE AND BULK ELASTIC WARES

[72] Inventors: Richard M. White; Robert E. Lee; Charles W. Turner, all of Berkeley, Calif.

[73] Assignee: The United States of America as represented by the Secretary of the Navy

[22] Filed: Sept. 25, 1970

[21] Appl. No.: 75,523

[52] U.S. Cl. ....................318/116, 310/8.1, 331/107 G

[51] Int. Cl. ....................H01v 7/00

[58] Field of Search..........331/107 G; 317/234 V; 310/8.1, 310/8.2, 8.3, 8.6, 9.5; 318/116

[56] References Cited

UNITED STATES PATENTS

| | | | |
|---|---|---|---|
| 3,515,911 | 6/1970 | Byram et al | 310/8.1 |
| 3,395,295 | 7/1968 | Crane | 310/8.2 X |
| 3,411,023 | 11/1968 | Quate et al | 310/8.1 X |

OTHER PUBLICATIONS

Hayakawa et al., "Generation of Coherent Ultrasonic Waves With GaAs Gunn Oscillator," 1/69, Applied Physics Letters.

Anderson et al., "Apparatus for Generation and Detection of Microwave Ultrasound," IBM Tech. Disclosure, 9/69, pp. 576.

Lean et al., "Gallium Arsenide Gunn Oscillator to Excite Surface Acoustic Waves," IBM Tech. Disclosure, pp. 2411, 1/71.

*Primary Examiner*—D. F. Duggan
*Attorney*—R. S. Sciascia and Charles D. B. Curry

[57] ABSTRACT

A source of high frequency elastic waves are generated by placing a Gunn effect oscillator in close proximity to a piezoelectric or an electrostrictive solid. The device creates a moving source of sound near the surface of the solid. The sound will be radiated from the surface of the solid as bulk or surface elastic waves. Elastic waves can be generated from both surfaces in certain situations.

8 Claims, 4 Drawing Figures

3673474
OR IN 318/116

INVENTORS
RICHARD M. WHITE
ROBERT E. LEE
CHARLES W. TURNER
ATTORNEY

*INVENTORS*
RICHARD M. WHITE
ROBERT E. LEE
CHARLES W. TURNER

ATTORNEY

MEANS FOR GENERATING (A SOURCE OF) SURFACE AND BULK ELASTIC WARES

The invention described herein may be manufactured and used by or for the Government of the United States of America for governmental purposes without the payment of any royalties thereon or therefor.

BACKGROUND OF THE INVENTION

This invention relates generally to a means for generating high frequency elastic waves, by placing a semiconductor diode in close proximity to an electrostrictive solid, and more particularly to the placing of a Gunn effect oscillator in close proximity to an electrostrictive or piezoelectric solid. The Gunn effect oscillator diode, in the transit-time mode of operation, is characterized by a high electric field domain which periodically propagates through the Gunn device. High amplitude electric fields extend from the Gunn device and penetrate the adjacent solid, causing stresses and strains owing to the piezoelectric or electrostrictive nature of that medium, thereby creating a moving source of elastic waves along the surface of the solid.

The prior method of generating coherent elastic plane waves at gigahertz frequencies in solids involved the application of rf electric fields at one plane surface of a piezoelectric substance. This type of wave generation was convenient since it required preparation of only one plane surface on the solid material, but the coupling was not particularly efficient. The efficiency of the prior system was dependent on the efficiency of the source producing the rf power, as well as the efficiency of the transducer process itself.

The method of the present invention for generating elastic waves does not directly involve the production of rf electrical power and a subsequent conversion to elastic waves. Thus the overall efficiency obtainable by this method is not limited by the efficiency of available rf power source.

The advantage of this method over other prior systems is that the frequency-generating mechanism is internal to the composite device. Moreover, the new device is less complex in construction than other sources utilizing separated rf generators coupled through wires to elastic wave transducing devices. Finally, the new source generator is readily adapted to the generation of very high frequency sound waves with minimum difficulty even with the small wave lengths involved.

It is the primary object of this invention to provide a frequency-generating mechanism that is internal to the composite device.

Another objective is to provide a less complex means for generating very high frequency sound waves.

Still another objective of this invention is to provide a means for generating source sound waves so that a number of sources may be placed together as one solid for signal-processing or display purposes.

Other objects and features will become apparent from the following description of the invention, and from the accompanying drawings in which.

Figure 1:
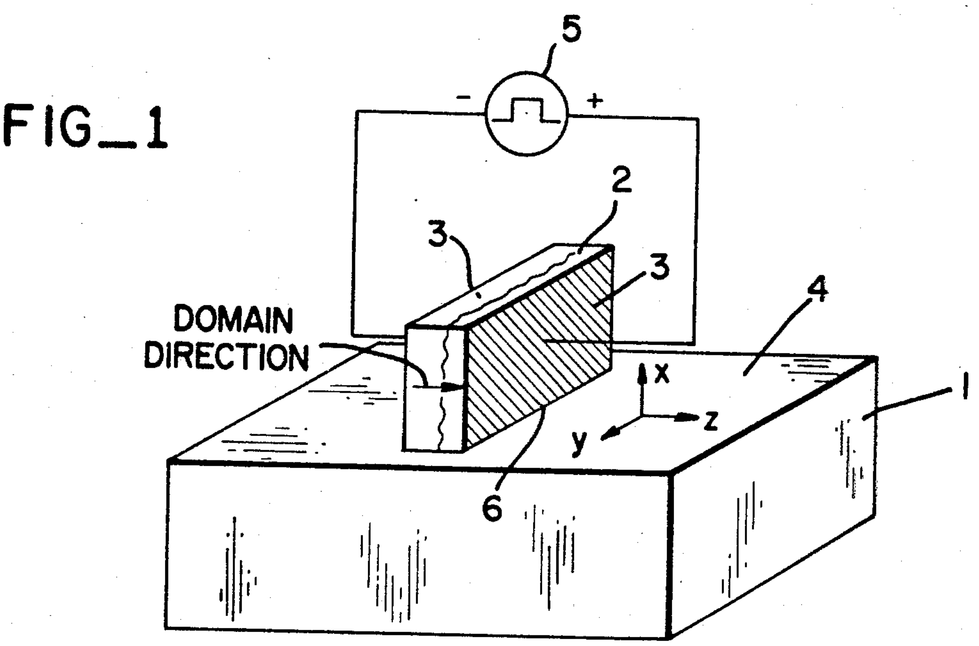
FIG. 1 is a drawing illustrating the new means for generating elastic waves.

Referring now to FIG. 1, where a piezoelectric solid 1 is placed adjacent to one oscillating semiconductor diode 2, or an electrostrictive, as a n-gallium-arsenide (GaAs) Gunn effect diode. For example, a diode which operates in the transit time mode at 114 $MH_z$ can be used. The diode is positioned with its ohmic contact surfaces 3 perpendicular to the polished plane surface 4 of the piezoelectric block 1, so domain motion direction is parallel to the polished plane surface 4. The interaction region lies at the interface 6 between the diode 2 and the adjacent piezoelectric or electrostrictive medium 1. It should be noted that it is desirable to use a diode in the shape of a thin plate, that is, the dimension in the X direction is small compared with the Y and Z dimensions (FIG. 1). Additionally, the cross sectional shape of the diode 2 should be uniform in the direction normal to the ohmic contacts 3 to obtain the desired operational characteristics. For example, if the dimensions of the diode in the X, Y and Z directions are: 0.97, 0.23, and 0.52 mm, respectively, then the surface area is equal to 0.5044 $mm^2$. Then both ohmic contacts would each have an area of 0.5044 $mm^2$. Diode 2 is powered either by a steady or pulsed direct current voltage supply 5. Diode 2 and block 1 should be placed quite close to each other. They may be in actual mechanical contact if the block is a sufficiently good electrical insulator. The diode and the solid may be fastened with wax or glue.

The transducer action depends upon the well-known existence of regions of high electric fields which move through the oscillating semi-conductor diode. These high field regions exist because of charge bunching in the diode. The amplitude of the electric fields inside and outside the diode may be many tens or hundreds of kilovolts per centimeter. Calculations and external probe measurements show that the regions of high electrical field may be well localized; typically in a gallium-arsenide (GaAs) Gunn-effect diode. The region may be a plane about one micron thick, parallel to the ohmic contacts. Thus, near the surface of the piezoelectric block adjacent to the diode there is a moving sound source, because there is a moving region in which eE (where *e* is a piezoelectric coupling coefficient and E is the component of the electric field) has a large gradient.

Figure 2:
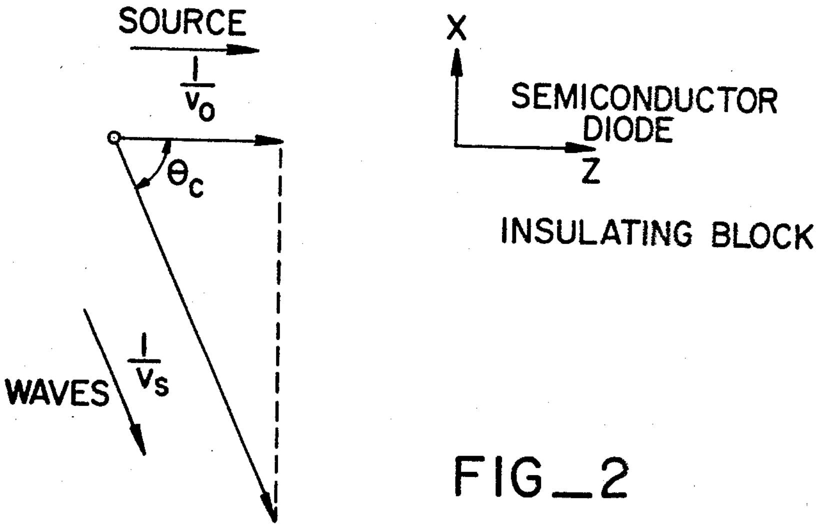
FIG. 2 is a cross-section showing XZ plane of FIG. 1 giving directions of elastic wave propagation $\theta_c$ and motion of wave sources at interference (X=O), where the source velocity is $V_0$, and the sound or acoustic velocity is $V_S$.

The velocity at which the sound source moves through diode 2 may be much higher than the velocity of sound in block 1. For example, in a gallium-arsenide Gunn-effect diode the former velocity, $V_0$ (Source velocity) is near the saturated electron drift velocity, typically $10^7$ cm/sec, while the velocity of sound (or acoustic velocity) $V_S$ in most solids is near $5 \times 10^5$ cm/sec. The situation is analogous to the formation of a shock wave by a supersonic projectile or by an energetic charged particle moving through an insulator, at a velocity greater than the velocity of electromagnetic waves in the medium. We can expect a single moving line source to produce an elastic wave propagating outward at an acute angle to the interface, as shown in FIG. 2. It is also interesting to note, that the acoustic power generated is proportional to the piezoelectric coefficient e of the gallium-arsenied squared whereas the relevant piezoelectric coefficient is equal to the adjacent medium. This is important since gallium arsenide is a relatively weak piezoelectric material while lithium niobate ($LiNbO_3$) is highly piezoelectric, the factor *e* being 900 times larger for $LiNb0_3$ than GaAs. Therefore, the new system utilizes two separate materials which can be chosen independently to optimize the desired interaction when joined together.

Referring again to FIG. 1, if a single source moves along the interface 6, a plane of elastic disturbance is produced, whose frequency spectrum reflects the wide frequency spectrum of the source itself. If a time-periodic sequence of sources moves along interface 6 then the spectra of both the source fields and the output will contain large components at the source repetition frequency; see FIG. 2. Moreover, the angle between the direction of domain propagation and the direction of acoustic energy radiation is large, approximately 87.5°; thus the system emits phase matched acoustic radiation continuously, during the period of travel by the electric field domain across the diode.

Referring again to FIG. 2 the ratio of source velocity to sound velocity determines the angle $\theta_c$, thus the angle $74_c$ may be changed varying the velocity $V_O$ (or $V_S$, which is difficult). It is also known that in certain Gunn effect diodes, the velocity $V_O$ is dependent on bias voltage and that $V_O$ changes up to 25 percent have been observed. Furthermore, if the bias polarity is reversed, the generated waves will travel to the left in FIGS. 1 and 2, rather than to the right. Therefore, it appears possible to make substantial digital changes in angle by reversing the polarity of the bias voltage and smaller incidental changes in angle by varying the amplitude of the bias voltage.

Semiconductor diodes exhibiting relatively well localized regions of high electric field have been operated at megahertz frequencies and in the 0.1 to 0.40 gigahertz range; the former have been elastic wave oscillators employing piezoelectric semiconductors and the latter have been Gunn-effect diodes which depend upon inter-valley scattering for their operation.

Figure 3:
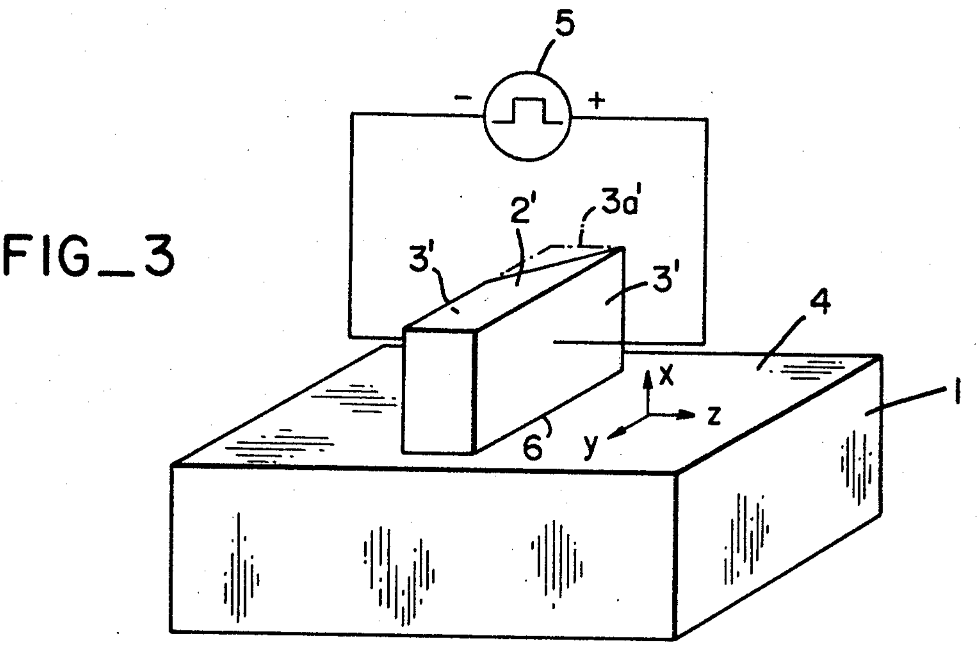
FIG. 3 is a cross-section illustrating a modified diode with a non-uniform cross sectional shape.

It should be noted that changes in the oscillation frequency can be achieved in some of the Gunn diodes with the use of appropriate external circuitry. For example, the frequency may be varied by varying the applied voltage. Referring to FIG. 3 the Gunn effect diode acoustic generator 2′ may be tuned by varying the voltage across the Gunn device if the cross sectional shape of the diode is not uniform in the direction normal to the contacts 3′. The diode may be constructed as shown in FIG. 3 with section 3*a*′ removed.

Because of high amplitude electric fields furnished by semiconductor oscillator diode, one can consider using electrostrictive solids as well as piezoelectric solids as block 1 of FIG. 1. The electrostrictive effect is present in all solids and fluids, and it produces particle displacements which are proportional to the square of the electric field, rather than to the first power of the field as is the case with piezoelectric substances. A compressional bulk wave can be produced by the electrostrictive solid, whereas a piezoelectric solid operated as shown in FIG. 1, both compressional and shear bulk waves would be produced.

Figure 4:
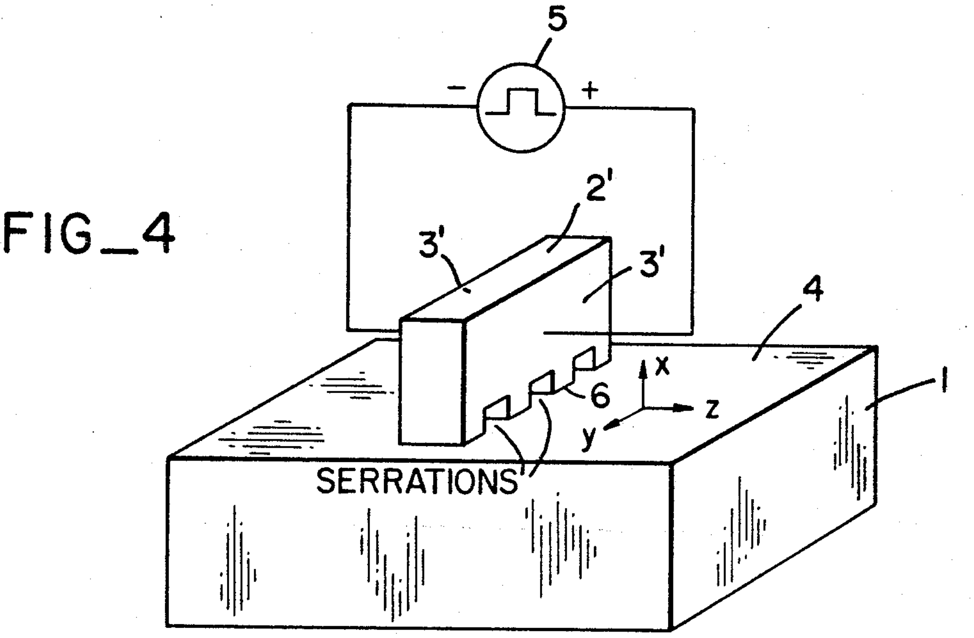
FIG. 4 is a cross-section showing a serrated diode system for surface wave generation.

It is important to note that the equivalent elastic waves can be produced with any type of diode or other structure which induces motion of domain regions of high electric fields periodically through the structure. This could include acousto-electric oscillator diodes and doped domain diodes having lower domain velocities. Moreover, the Gunn diode can be used to generate surface waves as well as bulk and elastic waves. Referring to FIG. 4, the Gunn diode 2′ is used as a source for surface waves. Only a small area near the edges of the diode is effective in generating the surface waves. Moreover, the areas which extend back from the edge more than one-half wave length ($\lambda$) are effectively nullified by other areas of the diode, thus radiating waves with the same phase. The relieved or serrated areas are far less effective wave generators than the raised or interface areas 6. Therefore, the source appears as a set of sources, separated by one wave length, so that their outputs add in phase. The serrations can be achieved by chemical etching or other standard means.

The above-described transducer has been found to be useful in many cases where elastic waves are presently employed, such as in a signal delay line having fixed or variable delay times, optical deflection systems as well as modulation devices.

Obviously, many modifications and variations of the present invention are possible in the light of the above teachings. It is therefore to be understood that within the scope of the appended claims the invention may be practiced otherwise than as specifically described.

What is claimed is:

1. A means for generating elastic waves in an electrostrictive solid comprising in combination:
   a. an electrostrictive solid having a polished surface;
   b. a uniformly shaped oscillating means comprising a bias means and a pair of ohmic contacts;
   c. said oscillating means positioned adjacent said polished solid;
   d. said oscillating means having a cross sectional shape uniform in the direction normal to said ohmic contacts to form an interface between said oscillating means and said polished surface;
   e. said oscillating means having said ohmic contacts perpendicular to said polished surface of said electrostrictive solid;
   f. a voltage source operatively connected to said oscillating means to apply a voltage to drive said oscillating means in one direction wherein said oscillating means generates elastic waves in said polished solid when said voltage source is actuated.

2. The apparatus recited in claim 1 wherein the oscillating means is a Gunn effect diode.

3. The apparatus recited in claim 1 wherein the oscillating means is a piezoelectric solid.

4. The apparatus recited in claim 1 where the amplitude of said bias is changed by varying the voltage of said voltage source.

5. The apparatus recited in claim 2 wherein the polarity of said bias means is changed.

6. The apparatus recited in claim 1 wherein the cross sectional shape of said diode is not uniform to said ohmic contacts wherein the amplitude of said bias means is varied by varying the voltage of said voltage source.

7. Apparatus recited in claim 1 wherein said electrostrictive solid having a polished surface is positioned adjacent said oscillating means to form an interface surface between said solid and said oscillating means.

8. Apparatus recited in claim 7 wherein the said interface surface of said oscillating means is serrated to form raised areas and relieved areas so that said raised areas are in contact with said solid.

* * * * *